US009012272B2

(12) United States Patent
Zhu et al.

(10) Patent No.: US 9,012,272 B2
(45) Date of Patent: Apr. 21, 2015

(54) MOSFET AND METHOD FOR MANUFACTURING THE SAME

(75) Inventors: Huilong Zhu, Poughkeepsie, NY (US); Qingqing Liang, Lagrangeville, NY (US); Zhijiong Luo, Poughkeepsie, NY (US); Haizhou Yin, Poughkeepsie, NY (US)

(73) Assignee: Institute of Microelectronics, Chinese Academy of Sciecnes, Beijing (CN)

( * ) Notice: Subject to any disclaimer, the term of this patent is extended or adjusted under 35 U.S.C. 154(b) by 549 days.

(21) Appl. No.: 13/379,444

(22) PCT Filed: Aug. 1, 2011

(86) PCT No.: PCT/CN2011/077858
§ 371 (c)(1),
(2), (4) Date: Dec. 20, 2011

(87) PCT Pub. No.: WO2013/004031
PCT Pub. Date: Jan. 10, 2013

(65) Prior Publication Data
US 2013/0009244 A1     Jan. 10, 2013

(30) Foreign Application Priority Data
Jul. 7, 2011   (CN) .......................... 2011 1 0189100

(51) Int. Cl.
*H01L 21/00*     (2006.01)
*H01L 21/84*     (2006.01)
(Continued)

(52) U.S. Cl.
CPC ...... *H01L 21/2652* (2013.01); *H01L 29/42384* (2013.01); *H01L 29/78648* (2013.01)

(58) Field of Classification Search
USPC .......................................... 257/347; 438/151
See application file for complete search history.

(56) References Cited

U.S. PATENT DOCUMENTS 6,043,535 A     3/2000   Houston
6,815,296 B2 *  11/2004  Dennard et al. ............... 438/283
(Continued)

FOREIGN PATENT DOCUMENTS

CN     1487597 A     4/2004
CN     1523649 A     8/2004
(Continued)

OTHER PUBLICATIONS

Yan et al., "Scaling the Si MOSFET: From Bulk to SOI to Bult", IEEE Transactions of Electron Devices, vol. 39, No. 7, Jul. 1992, pp. 1704-1710 (7 pages total).
(Continued)

*Primary Examiner* — Khiem D Nguyen
*Assistant Examiner* — Wilner Jean Baptiste
(74) *Attorney, Agent, or Firm* — Westman, Champlin & Koehler, P.A.

(57) ABSTRACT

The present application discloses an MOSFET and a method for manufacturing the same. The MOSFET comprises: a semiconductor substrate; a first insulation buried layer disposed on the semiconductor substrate; a back gate formed in a first semiconductor layer which is disposed on the first insulation buried layer; a second insulation buried layer disposed on the first semiconductor layer; source/drain regions formed in a second semiconductor layer which is disposed on the second insulation buried layer; a gate disposed on the second semiconductor layer; and electric connections to the source/drain regions, the gate and the back gate, wherein the back gate comprises first back gate regions of a first conductivity type which are disposed under the source/drain regions and a second back gate region of a second conductivity type which is disposed under a channel region, the first back gate regions adjoins the second back gate region, the first conductivity type is opposite to the second conductivity type, and the electric connection to the back gate comprise a conductive via contacted with one of the first back gate regions. The MOSFET, of any conductivity type, can have adjustable threshold voltage and reduced leakage current via the back gate between the source/drain regions by using the back gate in the form of a PNP junction or an NPN junction.

15 Claims, 8 Drawing Sheets

(51) Int. Cl.
*H01L 21/336* (2006.01)
*H01L 21/76* (2006.01)
*H01L 27/12* (2006.01)
*H01L 21/265* (2006.01)
*H01L 29/423* (2006.01)
*H01L 29/786* (2006.01)

(56) References Cited

U.S. PATENT DOCUMENTS

| | | | |
|---|---|---|---|
| 7,772,649 B2* | 8/2010 | Cheng et al. | 257/354 |
| 7,851,859 B2* | 12/2010 | Tak et al. | 257/347 |
| 2002/0063285 A1* | 5/2002 | Wu et al. | 257/347 |
| 2004/0046207 A1* | 3/2004 | Dennard et al. | 257/347 |
| 2004/0046208 A1* | 3/2004 | Dennard et al. | 257/347 |
| 2006/0086998 A1* | 4/2006 | Nagaoka | 257/500 |
| 2007/0132011 A1* | 6/2007 | Kato | 257/324 |
| 2008/0182380 A1* | 7/2008 | Oka | 438/425 |
| 2009/0212362 A1* | 8/2009 | Cheng et al. | 257/347 |
| 2010/0187607 A1 | 7/2010 | Dennard et al. | |
| 2011/0108942 A1* | 5/2011 | Fenouillet-Beranger et al. | 257/503 |

FOREIGN PATENT DOCUMENTS

| | | |
|---|---|---|
| CN | 101958327 A | 1/2011 |
| JP | 2001284596 A | 10/2001 |

OTHER PUBLICATIONS

International Search Report and Written Opinion from PCT Application No. PCT/CN2011/077858, dated Apr. 12, 2012, 8 pages.
Chinese Office Action dated Jul. 21, 2014 for corresponding Chinese Application No. 201110189100.X, filed Jul. 7, 2011.

* cited by examiner

US 9,012,272 B2

MOSFET AND METHOD FOR MANUFACTURING THE SAME

CROSS-REFERENCE TO RELATED APPLICATION

This application is a National Phase application of, and claims priority to, No. PCT/CN2011/077858, filed on Aug. 1, 2011, entitled "MOSFET AND METHOD FOR MANUFACTURING THE SAME", which claims priority to the Chinese Patent Application No. 201110189100.X, filed on Jul. 7, 2011, entitled "MOSFET AND METHOD FOR MANUFACTURING THE SAME", both the PCT Application and Chinese Application are incorporated herein by reference in their entireties.

TECHNICAL FIELD

The present disclosure relates to a MOSFET and a method for manufacturing the same, and in particular, to a MOSFET with a back gate and a method for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

It is disclosed in "Scaling the Si MOSFET: From bulk to SOI to bulk", Yan et al., IEEE Trans. Elect. Dev., Vol. 39, p. 1704, June, 1992, that a ground plane (i.e., a backgate being grounded) can be disposed below a buried oxide layer for suppressing short channel effects in an SOI MOSFET.

However, in the above conventional SOI MOSFET, the back gate is mainly used for increasing the threshold voltage of the device, and the back gate cannot be used for adjusting the threshold voltage flexibly. However, in the MOSFETs, it may be desirable on one hand that the threshold voltage of the device is increased to suppress the short channel effects, and on the other hand that the threshold voltage of the device is decreased to reduce power consumption in a low supply voltage application, or in an application using both P-type and N-type MOSFETs.

Furthermore, the MOSFETs may be damaged due to short circuit between source/drain regions via the back gate.

The back gate must be grounded or biased to a predetermined potential during operations. For this, an additional chip area is required for providing electrical contacts with the back gate, for example, to form additional vias and wirings.

SUMMARY OF THE DISCLOSURE

An object of the present disclosure is to provide a MOSFET which flexibly adjusts the threshold voltage of the device by a back gate and reduces leakage current between source/drain regions.

According to one aspect of the present disclosure, there is provided a method for manufacturing a MOSFET, comprising: providing an SOI wafer comprising a semiconductor substrate, a first buried insulating layer, a first semiconductor layer, a second buried insulating layer and a second semiconductor layer, from bottom to top; forming a back gate in the first semiconductor layer; forming source/drain regions in the second semiconductor layer; forming a gate on the second semiconductor layer; and providing electrical connections to the source/drain regions, the gate and the back gate, wherein the back gate comprises first back gate regions of a first conductivity type which are disposed under the source/drain regions and a second back gate region of a second conductivity type which is disposed under a channel region, the first back gate regions adjoin the second back gate region, the first conductivity type is opposite to the second conductivity type, and the electric connection to the back gate comprise a conductive via contacted with one of the first back gate regions.

According to another aspect of the present disclosure, there is provided a MOSFET, comprising: a semiconductor substrate; a first buried insulating layer disposed on the semiconductor substrate; a back gate formed in a first semiconductor layer which is disposed on the first buried insulating layer; a second buried insulating layer disposed on the first semiconductor layer; source/drain regions formed in a second semiconductor layer which is disposed on the second buried insulating layer; a gate disposed on the second semiconductor layer; and electric connections to the source/drain regions, the gate and the back gate, wherein the back gate comprises first back gate regions of a first conductivity type which are disposed under the source/drain regions and a second back gate region of a second conductivity type which is disposed under a channel region, the first back gate regions adjoin the second back gate region, the first conductivity type is opposite to the second conductivity type, and the electric connection to the back gate comprise a conductive via contacted with one of the first back gate regions.

In the MOSFET according to the present disclosure, the back gate is formed in the semiconductor layer as being in the form of a PNP junction or an NPN junction, while the buried insulating layer serves as a gate dielectric of the back gate.

The backgate is electrically connected to external circuits with portions of doping regions below one of the source/drain regions. When applying a control voltage to the back gate, the resultant electric field is applied to the channel region through the buried insulating layer. A threshold voltage is adjusted by capacitive coupling. Due to the asymmetric back gate, the voltage applied to the whole channel by the back gate is non-uniform. It thus improves the effect for suppressing the short channel effects.

For an N-type MOSFET, a back gate in the form of an NPN junction may be used for increasing the threshold voltage of the device, whereas a back gate in the form of a PNP junction may be used for reducing the threshold voltage of the device. It is opposite for a P-type MOSFET. Therefore, the back gate can be used to adjust a threshold voltage of a MOSFET of any conductivity type flexibly.

Furthermore, a back gate in the form of a PNP junction or an NPN junction avoids a conductive path being formed between source/drain regions, and leakage current via the back gate between the source/drain regions is thus decreased.

Preferably, a common conductive via is used for providing electrical connections to the back gate and an active region. Therefore, the back gate does not increase a footprint of the MOSFET on a wafer significantly.

DETAILED DESCRIPTION

Figure 1:
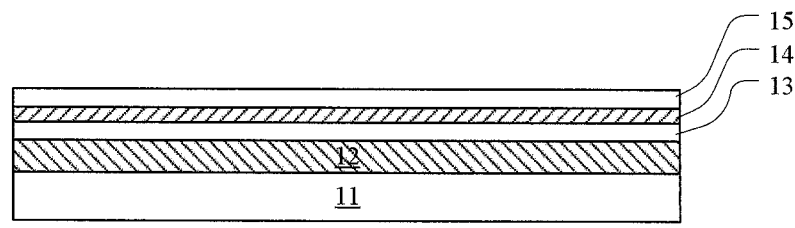
FIGS. 1-11 schematically show cross-sectional views of the semiconductor structure at various stages in a first embodiment of the method for manufacturing an ultra-thin MOSFET according to the present disclosure.

Exemplary embodiments of the present disclosure will be described in more details below with reference to the accompanying drawings. In the drawings, like reference numerals denote like members. The figures are not drawn to scale, for the sake of clarity.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including a semiconductor substrate and all of the layers and regions having been formed on the semiconductor substrate.

According to a first embodiment according to the present disclosure, the steps shown in FIGS. 1 to 11 are performed in sequence for manufacturing an ultra-thin SOI MOSFET.

As shown in FIG. 1, an SOI wafer is used as an initial structure of the semiconductor substrate, which comprises a semiconductor substrate 11, a first buried insulating layer 12, a first semiconductor layer 13, a second buried insulating layer 14 and a second semiconductor layer 15, from bottom to top. The first buried insulating layer 12 may have a thickness of about 20-100 nm, the first semiconductor layer 13 may have a thickness of about 10-100 nm, the second buried insulating layer 14 may have a thickness of about 5-30 nm, and the second semiconductor layer 15 may have a thickness of about 5-20 nm.

The first semiconductor layer 13 and the second semiconductor layer 15 may be made of a material selected from Group IV semiconductor materials (such as Si or Ge) or Group III-V semiconductor materials (such as, gallium arsenide), for example, single crystal silicon or SiGe. For example, the first buried insulating layer 12 and the second buried insulating layer 14 may be made of oxides or nitrides, for example, $SiO_2$.

In the finished MOSFET, the first semiconductor layer 13 will be used for providing a back gate of the MOSFET, and the second semiconductor layer 15 will be used for providing a channel region and portions of the source/drain regions of the MOSFET. The first buried insulating layer 12 is used for electrically isolating the back gate from the semiconductor substrate, and the second buried insulating layer 14 will serve as a back gate dielectric.

The process for providing an SOI wafer is well known in the art. For example, SmartCut™ process (referred as "Smart Cut" or "Smart Strip") can be used for this purpose. The SmartCut™ process comprises the steps of bonding two wafers with each other, each of which has a surface oxide layer formed by thermal oxidation or deposition, and one of which is subjected to hydrogen implantation so as to form a hydrogen implantation region at a predetermined depth in the silicon body below the surface oxide layer; converting the hydrogen implantation region to a layer having micro-cavities under the conditions of an increased pressure and an increased temperature; and separating one of the two wafers from the other of the two wafers. The other of the two wafers is used as an SaI wafer. By controlling process parameters in thermal oxidation or in the deposition, a thickness of the buried oxide layer in the SOI wafer can be changed. By controlling implantation energy during the hydrogen implantation, a thickness of the top semiconductor layer in the SOI wafer can be varied.

As an example, an SOI wafer shown in FIG. 1 can be obtained by performing above-mentioned steps of wafer bonding, hydrogen implantation and layer separation twice.

Figure 2:
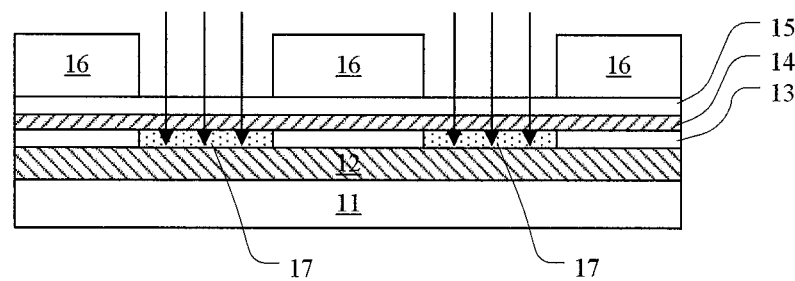

Next, a photoresist layer is formed on the second semiconductor layer 15. The photoresist layer is exposed and developed to form a photoresist mask 16 with a pattern. The photoresist mask 16 comprises an opening which is approximately aligned with one of the source/drain regions. A first ion implantation is performed using the photoresist mask 16, such that implanted ions pass through the opening in the photoresist mask 16, penetrate the second semiconductor layer 15 and the second buried insulating layer 14 from top to bottom, and reach and are distributed in the first semiconductor layer 13 to form a first back gate region 17 of a first conductivity type, as shown in FIG. 2. It is known for those skilled in the art that a depth of the ion implantation can be controlled by adjusting energy for the ion implantation.

The doping concentration used in the first ion implantation may be about $10^{17}$-$10^{20}$ cm$^{-3}$.

The type of the dopant used in the first ion implantation depends on the type of the MOSFET and the expected adjustment effect for the threshold voltage. If the dopant type is identical to the conductivity type of the MOSFET, the threshold voltage of the device will be increased. On the contrary, if the dopant type is opposite to the conductivity type of the MOSFET, the threshold voltage of the device will be reduced. For example, for an N-type MOSFET, an N-type dopant is used in the first ion implantation for increasing the threshold voltage.

As an N-type dopant, arsenic (As), phosphor (P) or a combination thereof may be used. As a P-type dopant, boron (B or BF2), Indium (In) or a combination thereof may be used.

Figure 3:
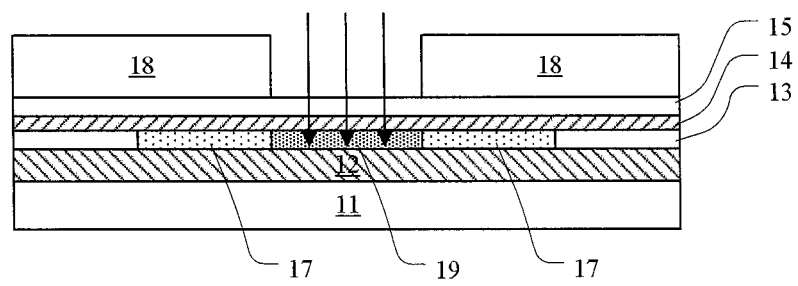

Next, the photoresist mask 16 is removed by dissolution in a solvent or ashing. A photoresist mask 18 with a pattern is formed on the second semiconductor layer 15 again. The photoresist mask 18 comprises an opening which is approximately aligned with the channel region to be formed. A second ion implantation is performed using the photoresist mask 18, such that implanted ions pass through the opening in the photoresist mask 18, penetrate the second semiconductor layer 15 and the second buried insulating layer 14 from top to bottom, and reach and are distributed in the first semiconductor layer 13 to form a second back gate region 19 of a second conductivity type, as shown in FIG. 3.

The doping concentration used in the second ion implantation may be about $10^{17}$-$10^{20}$ cm$^{-3}$.

The type of the dopant used in the second ion implantation is opposite to that used in the first ion implantation, in other words, the second conductivity type is opposite to the first conductivity type.

The photoresist mask 16 used in the first ion implantation is substantially aligned with the photoresist mask 18 used in the second ion implantation, such that the first back gate regions 17 adjoins the second back gate region 19 adjoin to form a PNP junction or an NPN junction. For example, for an N-type MOSFET, a P-type dopant is used in the second back gate implantation such that an NPN junction is formed by the first back gate implantation and the second back gate implantation.

Figure 4:
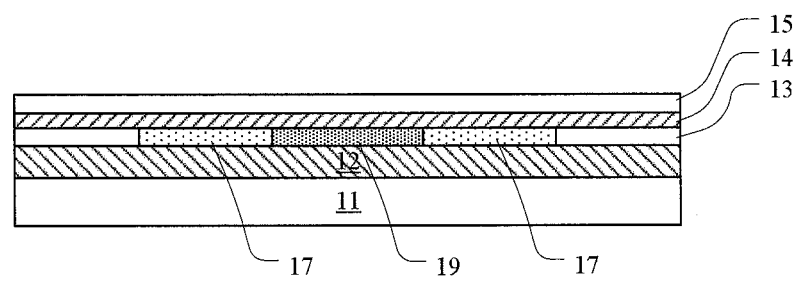

Next, the photoresist mask 18 is removed by dissolution in a solvent or ashing, and an annealing treatment is performed to activate the dopant, as shown in FIG. 4.

Next, by a conventional deposition process, a pad oxide layer 20 with a thickness of about 5-10 nm is formed on the second semiconductor layer 15, and a nitride layer 21 with a thickness of about 50-120 nm is formed on the pad oxide layer 20.

Figure 5:
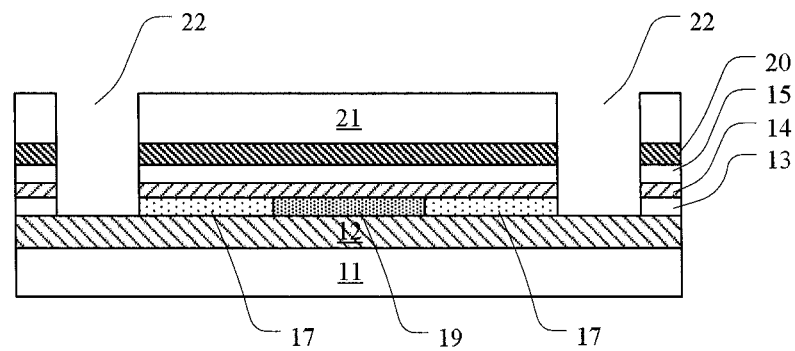

Two shallow trench isolation (STI) openings 20 are formed by patterning in the first semiconductor layer 13, the second buried insulating layer 14, the second semiconductor layer 15, the pad oxide layer 20 and the nitride layer 21. The shallow trench isolation (STI) openings 22 are used for defining an active region of the MOSFET. The shallow trench isolation (STI) openings 22 also expose one side surface of each of the first back gate regions 17, as shown in FIG. 5.

The patterning process may involve the following steps: a photoresist mask with a pattern is formed on the nitride layer 21, by a conventional lithographical process including exposure and development steps; the exposed portions of the nitride layer 21, the pad oxide layer 20, the second semiconductor layer 15, the second buried insulating layer 14, the first semiconductor layer 13 are removed by dry etching such as ion beam milling, plasma etching, reactive ion etching, laser ablation and the like, or wet etching using a solution of etchant, stopping on the top of the first buried insulating layer 12; and the photoresist mask is then removed by dissolution in a solvent or ashing.

Figure 6:
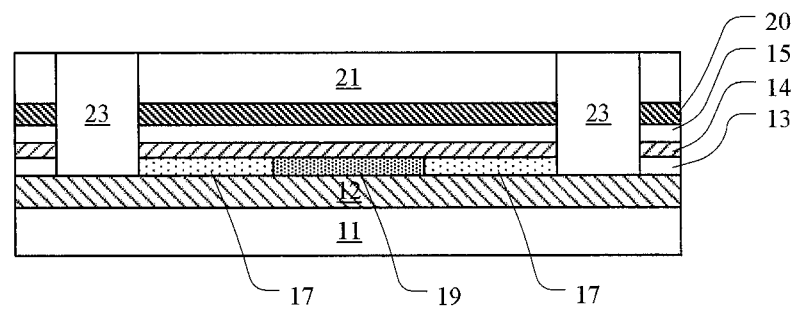
Figure 7:
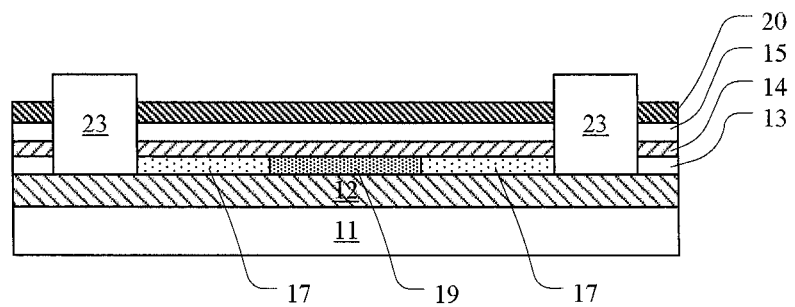

Next, an oxide layer is formed on the whole surface of the semiconductor structure by the above-mentioned conventional deposition process. The oxide layer fills up the shallow trench isolation opening 22. After that, with the nitride layer 21 as a stop layer, chemical-mechanical polishing (CMP) is performed on the oxide layer to form an oxide filler 23 which adjoins the first back gate regions 17, as shown in FIG. 6.

Figure 8:
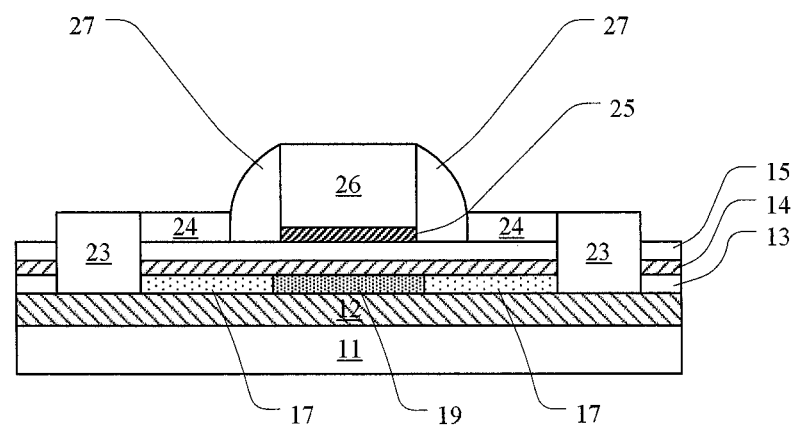

Next, the oxide filler 23 is etched back. The nitride layer 21 is then completely removed by etching, as shown in FIG. 6. Next, the pad oxide layer 20 is removed by dry etching or wet etching which stops at the top surface of the second semiconductor layer 15. After that, a third semiconductor layer 24 is epitaxially grown on the second semiconductor layer 15 to form raised source/drain regions. A gate stack and sidewall spacers 27 surrounding the gate stack are formed on the second semiconductor layer 15 between the source/drain regions, as shown in FIG. 8.

The gate stack comprises a gate dielectric layer 25 having a thickness of about 1-4 nm and a gate conductor 26 having a thickness of about 30-100 nm.

The gate conductor 26 is typically patterned into strips. Deposition process and patterning process for forming the gate stack are well known.

The gate dielectric layer 25 is made of one selected from the group consisting of oxides, oxynitrides, high K and their combinations. The gate conductor 26 can be for example a metal layer, a doped polysilicon layer, or a multilayer gate conductor including a metal layer and a doped polysilicon layer.

After forming sidewall spacers, a source/drain implantation is performed in the portions of the second semiconductor layer 15 and the third semiconductor layer 24 on both sides of the gate stack, to form source/drain regions. Preferably, the source/drain regions are formed in self-aligned manner. A spike annealing treatment is performed at a temperature of 900-1100° C. to activate impurities in the source/drain regions.

Preferably, source/drain extensions and halos are also formed. To form the source/drain extensions (not shown), an ion implantation of As or P is performed for an N-type MOSFET, and an ion implantation of B, BF2 or In is performed for a P-type MOSFET. To form the source/drain halos (not shown), an ion implantation of B, BF2 or In is performed for an N-type MOSFET, and an ion implantation of As or P is performed for a P-type MOSFET.

Figure 9:
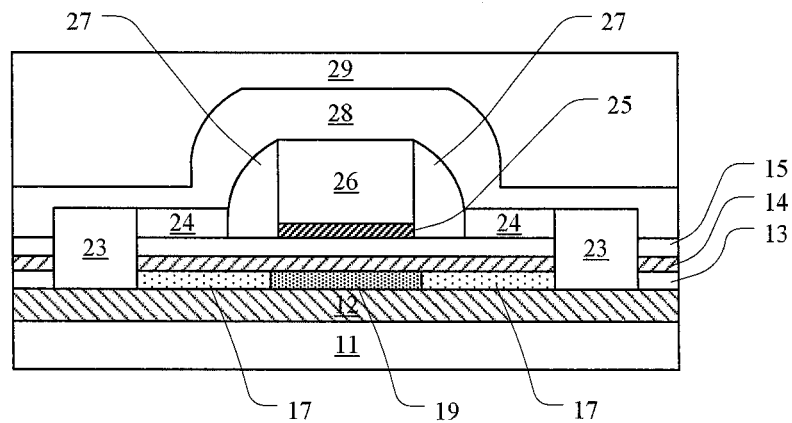

Next, a nitride layer 28 with a thickness of about 30-100 nm and an oxide layer 29 with a thickness of about 50-300 nm are formed on the whole semiconductor structure in sequence by a conventional CMOS process. Next, chemical-mechanical polishing is performed to obtain a planar structure surface, as shown in FIG. 9. The nitride layer 28 and the oxide layer 29 serve as an interlayer dielectric together.

Figure 10:
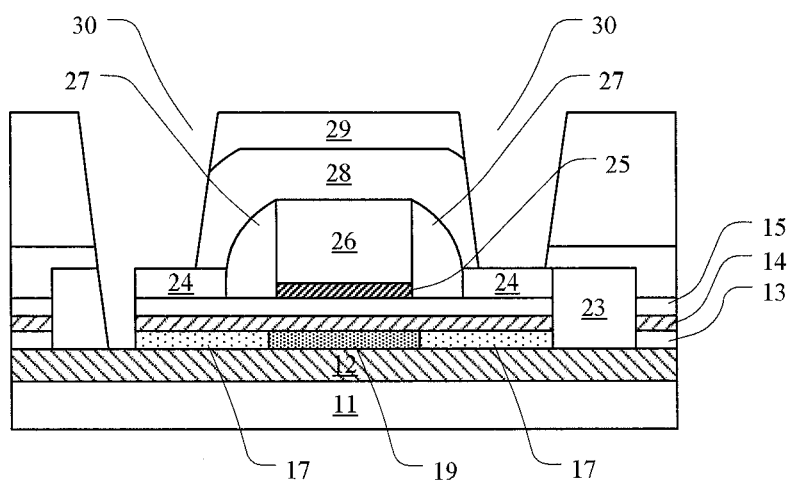
Figure 11:
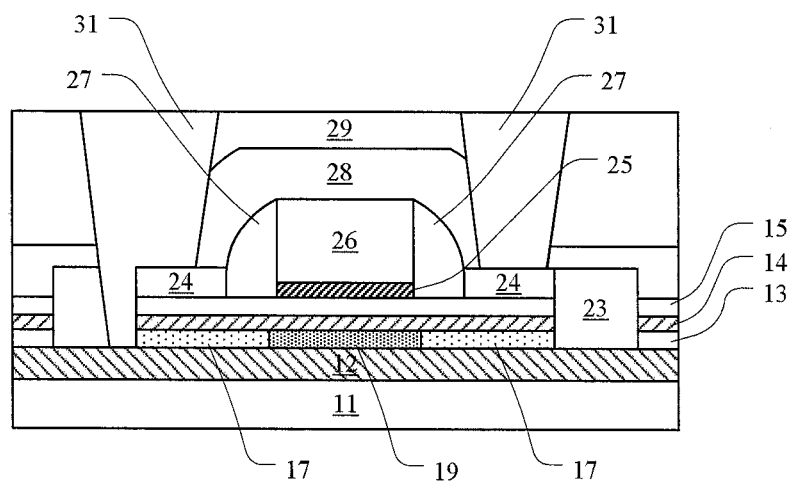

Next, using a photoresist mask with a pattern (not shown), contact holes 30, which reach the source region, the drain region and the back gate 30, are formed by dry etching or wet etching (as shown in FIG. 10). Conductive vias 31 are formed by filling the contact holes 30 with a conductive material, and removing the portion of the conductive material outside of the contact holes 30 (as shown in FIG. 11). The conductive material can be but not limited to Cu, Al, W, polysilicon and other similar conductive materials.

Preferably, a liner layer with a thickness of about 1-10 nm (not shown) may be formed on inner walls of the contact holes 30 by the above-mentioned conventional deposition process. The material of the liner layer may be, but not limited to, one of Ta, TaN, Ti, TiN and Ru, or any combination thereof.

As shown by FIG. 11, one of the first back gate regions 17 shares a common conductive via 31 with one of the source/drain regions. No electric connection to external circuits is provided for the other of the first back gate regions 17.

Figure 12:
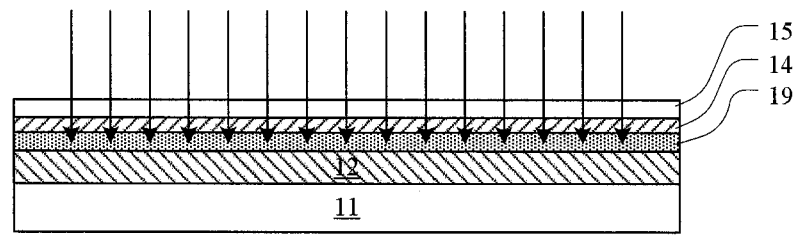
FIGS. 12 and 13 schematically show cross-sectional views of the semiconductor structure at some stages in a second embodiment of the method for manufacturing an ultra-thin MOSFET according to the present disclosure.
Figure 13:
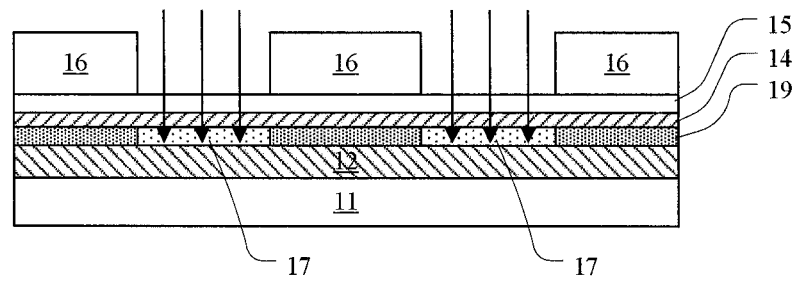

According to the second embodiment of the present disclosure, the steps for forming the back gate in the method for manufacturing an ultra thin MOSFET are performed as shown in FIGS. 12 and 13, where elements similar to those in the first embodiment are denoted by similar reference numerals.

The second embodiment differs from the first embodiment in that: the steps shown in FIGS. 2 and 3 are replaced by the following steps: firstly, a dopant of the second conductivity type is implanted into the whole first semiconductor layer 13 to form a second back gate region 19 of the second conductivity type, as shown in FIG. 12; secondly, a dopant of the first conductivity type with a higher dose is implanted into the second back gate region 19 by using a photoresist mask 16 to form first back gate regions 17 of the first conductivity type, as shown in FIG. 13. The photoresist mask 16 comprises an opening which is approximately aligned with one of the source/drain regions.

The remaining steps of the second embodiment are the same as those of the first embodiment.

Compared with the first embodiment, the second embodiment reduces the number of the photoresist masks and does not require alignment between the photoresist masks, which simplifies the semiconductor process.

Figure 14:
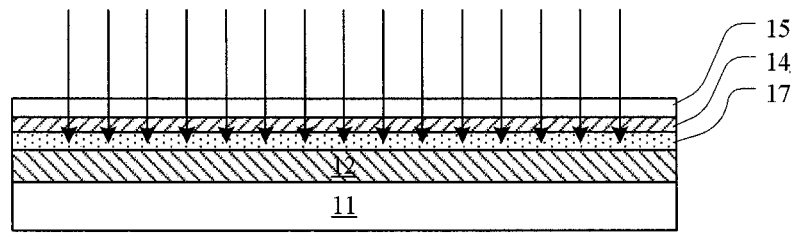
FIGS. 14 and 15 schematically show cross-sectional views of the semiconductor structure at some stages in a third embodiment of the method for manufacturing an ultra-thin MOSFET according to the present disclosure.
Figure 15:
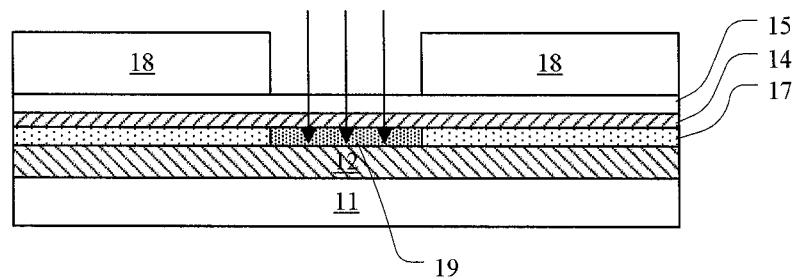

According to the third embodiment of the present disclosure, the steps for forming the back gate in the method for manufacturing an ultra thin MOSFET are performed as shown in FIGS. 14 and 15, where elements similar to those in the first embodiment are denoted by similar reference numerals.

The third embodiment differs from the first embodiment in that: the steps shown in FIGS. 2 and 3 are replaced by the following steps: firstly, a dopant of the first conductivity type is implanted into the whole first semiconductor layer 13 to form a first back gate region 17 of the first conductivity type, as shown in FIG. 14; secondly, a dopant of the second conductivity type with a higher dose is implanted into the first back gate region 17 by using a photoresist mask 18 to form a second back gate region 19 of the second conductivity type, as shown in FIG. 15. The photoresist mask 18 comprises an opening which is approximately aligned with the channel region to be formed.

The remaining steps of the third embodiment are the same as those of the first embodiment.

Compared with the first embodiment, the third embodiment reduces the number of the photoresist masks and does not require alignment between the photoresist masks, which simplifies the semiconductor process.

Figure 16:
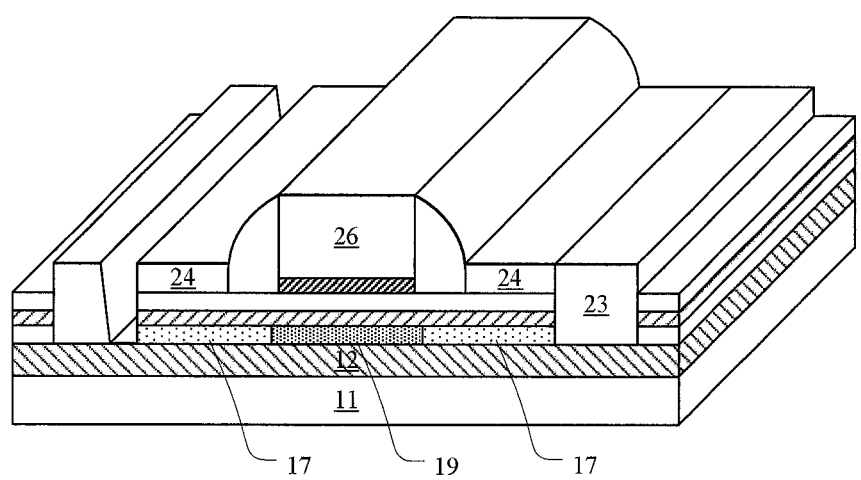
FIG. 16 schematically shows a perspective view of an ultra-thin MOSFET according to the present disclosure.

FIG. 16 schematically shows a perspective view of an ultra thin MOSFET according to the present disclosure, in which an inter-layer dielectric layer (i.e. the nitride layer 28 and the oxide layer 29 shown in FIG. 11) and conductive vias (i.e. the conductive vias 31 shown in FIG. 11) are not shown. In the MOSFET according to the present disclosure, the first semiconductor layer 13 is used for providing a back gate of the MOSFET, and the second semiconductor layer 15 is used for providing a channel region and portions of the source/drain regions of the MOSFET. The first buried insulating layer 12 is used for electrically isolating the back gate from the semiconductor substrate, and the second buried insulating layer 14 will serve as a gate dielectric of the back gate. The back gate comprises the first back gate regions 17 of the first conductivity type which are disposed under the source/drain regions, and the second back gate region 19 of the second conductivity type which is disposed under the channel region, and the first conductivity type is opposite to the second conductivity type. The first back gate regions 17 adjoins the second back gate region 19. Preferably, the back gate shares a common conductive via with for providing electric connection the one of the source/drain regions.

While the disclosure has been described with reference to specific embodiments, the description is illustrative of the disclosure. The description is not to be considered as limiting the disclosure. The description is not to be considered as limiting the disclosure.

We claim:

1. A method for manufacturing a MOSFET, comprising:
    providing an SOI wafer comprising a semiconductor substrate, a first buried insulating layer, a first semiconductor layer, a second buried insulating layer and a second semiconductor layer from bottom to top;
    forming a back gate in the first semiconductor layer;
    forming source/drain regions in the second semiconductor layer;
    forming a gate on the second semiconductor layer; and
    providing electrical connections to the source/drain regions, the gate and the back gate,
    wherein the back gate comprises first back gate regions of a first conductivity type which are disposed under the source/drain regions and a second back gate region of a second conductivity type which is disposed under a channel region, the first back gate regions adjoin the second back gate region, the first conductivity type is opposite to the second conductivity type, and the electric connection to the back gate comprise a conductive via contacted with one of the first back gate regions, and
    wherein the electric connections to the source/drain regions comprise conductive vias in contact with the source/drain regions, and one of the first back gate regins shares a common conductive via with one of the source/drain region.

2. The method according to claim 1, wherein the step of forming the back gate comprises:
    performing an ion implantation on portions of the first semiconductor layer under the source/drain regions to form the first back gate regions of the first conductivity type; and
    performing an ion implantation on a portion of the first semiconductor layer under the channel region to form the second back gate region of the second conductivity type.

3. The method according to claim 1, wherein the step of forming the back gate comprises:
    performing an ion implantation on the whole first semiconductor layer to form the second back gate region of the second conductivity type; and
    performing an ion implantation on portions of the first semiconductor layer under the source/drain regions to form the first back gate region of the first conductivity type.

4. The method according to claim 1, wherein the step of forming the back gate comprises:
    performing an ion implantation on the whole first semiconductor layer to form the first back gate regions of the first conductivity type; and
    performing an ion implantation on a portion of the first semiconductor layer under the channel region to form the second back gate region of the second conductivity type.

5. The method according to claim 1, wherein the first back gate regions and the second back gate region form a PNP junction.

6. The method according to claim 5, wherein the MOSFET is n-type.

7. The method according to claim 1, wherein the first back gate regions and the second back gate region form an NPN junction.

8. The method according to claim 7, wherein the MOSFET is p-type.

9. The method according to claim 1, wherein the step of forming source/drain regions comprises:
    epitaxially growing a third semiconductor layer on the second semiconductor layer; and
    performing a source/drain implantation in the second semiconductor layer and the third semiconductor layer to form raised source/drain regions.

10. A MOSFET, comprising:
    a semiconductor substrate;
    a first buried insulating layer disposed on the semiconductor substrate;
    a back gate formed in a first semiconductor layer which is disposed on the first buried insulating layer;
    a second buried insulating layer disposed on the first semiconductor layer;
    source/drain regions formed in a second semiconductor layer which is disposed on the second buried insulating layer;
    a gate disposed on the second semiconductor layer; and
    electrical connections to the source/drain regions, the gate and the back gate, wherein the back gate comprises first back gate regions of a first conductivity type which are disposed under the source/drain regions and a second back gate region of a second conductivity type which is disposed under a channel region, the first back gate regions adjoin the second back gate region, the first conductivity type is opposite to the second conductivity type, and an electric connection to the back gate comprise a conductive via contacted with one of the first back gate regions, and wherein the electric connections to the source/drain regions comprisse conductive vias in contact with the source/drain regions, and one of the first back gate regions shares a common conductive via with one of the source/drain regions.

11. The MOSFET according to claim 10, wherein the first back gate regions and the second back gate region form a PNP junction.

12. The MOSFET according to claim 11, wherein the MOSFET is n-type.

13. The MOSFET according to claim 10, wherein the first back gate regions and the second back gate region form an NPN junction.

14. The MOSFET according to claim 13, wherein the MOSFET is p-type.

15. The MOSFET according to claim 10, further comprising a third semiconductor layer epitaxially grown on the second semiconductor layer, wherein the source/drain regions are raised source/drain regions formed in the second semiconductor layer and the third semiconductor layer.

* * * * *